US006969538B2

(12) United States Patent
Deguchi et al.

(10) Patent No.: US 6,969,538 B2
(45) Date of Patent: Nov. 29, 2005

(54) METHOD FOR HEAT PROCESSING OF SUBSTRATE

(75) Inventors: Masatoshi Deguchi, Kumamoto (JP); Eiichi Sekimoto, Kumamoto (JP); Koichi Asaka, Kumamoto (JP); Yuji Matsuyama, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 153 days.

(21) Appl. No.: 09/947,474

(22) Filed: Sep. 7, 2001

(65) Prior Publication Data

US 2002/0034714 A1    Mar. 21, 2002

(30) Foreign Application Priority Data

Sep. 19, 2000    (JP) ............................. 2000-283407

(51) Int. Cl.$^7$ ............................................... B05D 3/02
(52) U.S. Cl. ..................... 427/240; 427/425; 427/379; 427/374.1; 427/385.5; 427/393.6; 118/52; 118/320; 118/59; 118/66; 118/69; 438/758; 438/780; 438/778; 396/611; 430/311
(58) Field of Search ................ 427/240, 425, 427/379, 374.1, 385.5, 393.6; 118/52, 320, 118/59, 66, 69; 438/758, 780, 778; 396/611; 430/311

(56) References Cited

U.S. PATENT DOCUMENTS

| | | | | |
|---|---|---|---|---|
| 5,529,626 A | * | 6/1996 | Stewart ....................... 118/500 |
| 5,660,634 A | * | 8/1997 | Fujiyama et al. ........... 118/319 |
| 5,968,691 A | * | 10/1999 | Yoshioka et al. ............. 430/30 |
| 6,002,108 A | * | 12/1999 | Yoshioka ..................... 219/388 |
| 6,027,856 A | * | 2/2000 | Nozaki et al. ............ 430/281.1 |
| 6,066,574 A | * | 5/2000 | You et al. .................... 438/781 |
| 6,350,316 B1 | * | 2/2002 | Hayashi et al. ................ 118/52 |
| 6,458,713 B1 | * | 10/2002 | Yamada et al. .............. 438/758 |
| 6,530,340 B2 | * | 3/2003 | You et al. .................... 118/696 |
| 2003/0027083 A1 | * | 2/2003 | Fuller et al. ................. 430/322 |

FOREIGN PATENT DOCUMENTS

| | | |
|---|---|---|
| JP | 61-201426 | 9/1986 |
| JP | 62-113141 | 5/1987 |
| JP | 63-164216 | 7/1988 |
| JP | 11-008175 | 1/1999 |
| JP | 11-045843 | 2/1999 |
| JP | 2000-091218 | 3/2000 |

* cited by examiner

Primary Examiner—Jennifer Michener
(74) Attorney, Agent, or Firm—Rader, Fishman & Grauer PLLC

(57) ABSTRACT

The present invention relates to a method for heat processing a substrate. After a coating film is formed on the substrate, the substrate is baked at a predetermined high temperature. The baking step is performed by first increasing the substrate temperature from a predetermined low temperature to a predetermined intermediate temperature that is lower than a predetermined reaction temperature at which the coating film reacts. Next, a second baking step maintains the substrate at the predetermined intermediate temperature for a predetermined period of time, and is followed by a third step of increasing the temperature of the substrate to the predetermined high temperature that is higher than the predetermined reaction temperature. This results in uniform temperature within the surface of the substrate when the temperature of the substrate reaches the reaction temperature. Consequently, a chemical reaction due to heat processing of the coating film within the surface of the substrate is performed uniformly.

8 Claims, 9 Drawing Sheets ical reaction of the coating film within the surface of the substrate is started at the same time, resulting in the realization of uniform heat processing of the substrate.
METHOD FOR HEAT PROCESSING OF SUBSTRATE

BACKGROUND OF THE INVENTION

1. Field of the Invention

The present invention relates to a method and an apparatus for heat processing of a substrate.

2. Description of the Related Art

In a photolithography process in the fabrication of a semiconductor device, various heat processings such as baking processing (prebaking) for vaporizing a solvent in a coating film after a resist solution is applied on the surface of a semiconductor wafer (hereinafter called "a wafer") to form the coating film, baking processing (post-exposure baking) for promoting a chemical reaction of the coating film after a pattern is exposed, cooling processing after each baking processing, and the like are performed.

For example, in the aforesaid post-exposure baking processing, in order to activate an acid as a catalyst produced in the coating film by exposure, the temperature of the wafer is increased nonstop to a temperature between about 120° C. and about 160° C. so as to exceed a reaction temperature at which the acid is activated, for example, 80° C., and the wafer is baked at that temperature for a predetermined period of time.

Experimentation by the inventor, et al., however, reveals that when the temperature of the wafer is increased nonstop to the temperature between 120° C. and 160° C., the temperature within the surface of the wafer is made nonuniform in the early stage and not increased uniformly as shown in FIG. 9.

Accordingly, when the temperature is rapidly increased nonstop, the temperature of the wafer exceeds the reaction temperature while the temperature within the surface of the wafer is nonuniform, and hence the timings in which the temperature reaches the reaction temperature and the timings in which a reaction is started differ from portion to portion within the surface of the wafer. As a result, difference in reaction period occurs within the surface of the wafer, finally leading to the nonuniformity of the line width of a pattern formed on the wafer and a reduction in yield.

SUMMARY OF THE INVENTION

The present invention is made in view of such a point, and its object is to provide a heat processing method for increasing the temperature of a substrate so that the temperature within the surface of the substrate is made uniform when the temperature of the substrate such as a wafer or the like is increased and exceeds a reaction temperature and a heat processing apparatus for carrying out this heat processing method.

To attain the aforesaid object, a method of the present invention is a method for heat processing of a substrate having the step of baking the substrate, on which a coating film is formed, at a predetermined high temperature comprising, before the step of baking the substrate, a first step of increasing the temperature of the substrate from a predetermined low temperature to a predetermined intermediate temperature lower than a predetermined reaction temperature at which the coating film reacts, a second step of maintaining the substrate at the predetermined intermediate temperature for a predetermined period of time, and a third step of thereafter increasing the temperature of the substrate to the predetermined high temperature higher than the predetermined reaction temperature.

Incidentally, the reaction temperature means a temperature at which a chemical reaction is started within the coating film by increasing the temperature of the substrate.

By temporarily increasing the temperature of the substrate to the intermediate temperature lower than the reaction temperature, maintaining the substrate at this intermediate temperature for the predetermined period of time, and thereafter increasing the temperature of the substrate to the high temperature higher than the reaction temperature when the temperature of the substrate is increased as in the present invention, the temperature within the surface of the substrate can be made uniform when the temperature of the substrate reaches the reaction temperature. Thereby, the temperature of each portion within the surface of the substrate reaches the reaction temperature in the same timing, and hence the timing in which the reaction is started is made uniform within the surface of the substrate. As a result, the chemical reaction of the coating film within the surface of the substrate is performed uniformly.

The method may further comprise the step of decreasing the temperature of the substrate after the step of baking the substrate. By decreasing the temperature of the substrate after the step of baking the substrate as described above, it becomes possible to stop the reaction of the coating film on the substrate and appropriately control the reaction period of the coating film. In this case, by decreasing the temperature of the substrate stepwise, the temperature of the substrate can be decreased while the ununiformity of the temperature within the surface of the substrate being suppressed.

An apparatus of the present invention is a heat processing apparatus for subjecting a substrate on which a coating film is formed to heat processing, comprising a first heating plate for mounting a substrate thereon and heating the substrate to a first predetermined temperature lower than a reaction temperature of the coating film, a second heating plate for mounting the substrate thereon and heating the substrate to a second predetermined temperature higher than the reaction temperature, and a temperature decreasing plate for mounting the substrate thereon and decreasing the temperature of the substrate.

According to the heat processing apparatus of the present invention, it is possible to make the temperature within the surface of the substrate uniform before the temperature of the coating film on the substrate reaches the reaction temperature and thereafter make the temperature of the coating film on the substrate reach the reaction temperature, whereby the chemical reaction of the coating film within the surface of the substrate is started at the same time, resulting in the realization of uniform heat processing of the substrate.

If the first heating plate and the second heating plate are provided in one and the same processing chamber, the temperature decreasing plate is provided in the other processing chamber, and a partition plate for keeping hot atmospheres separate is provided between the one processing chamber and the other processing chamber, heat interference between respective processing chambers with different processing temperatures is suppressed, whereby heat processing can be performed appropriately in each processing chamber.

DETAILED DESCRIPTION OF THE PREFERRED EMBODIMENT

Figure 1:
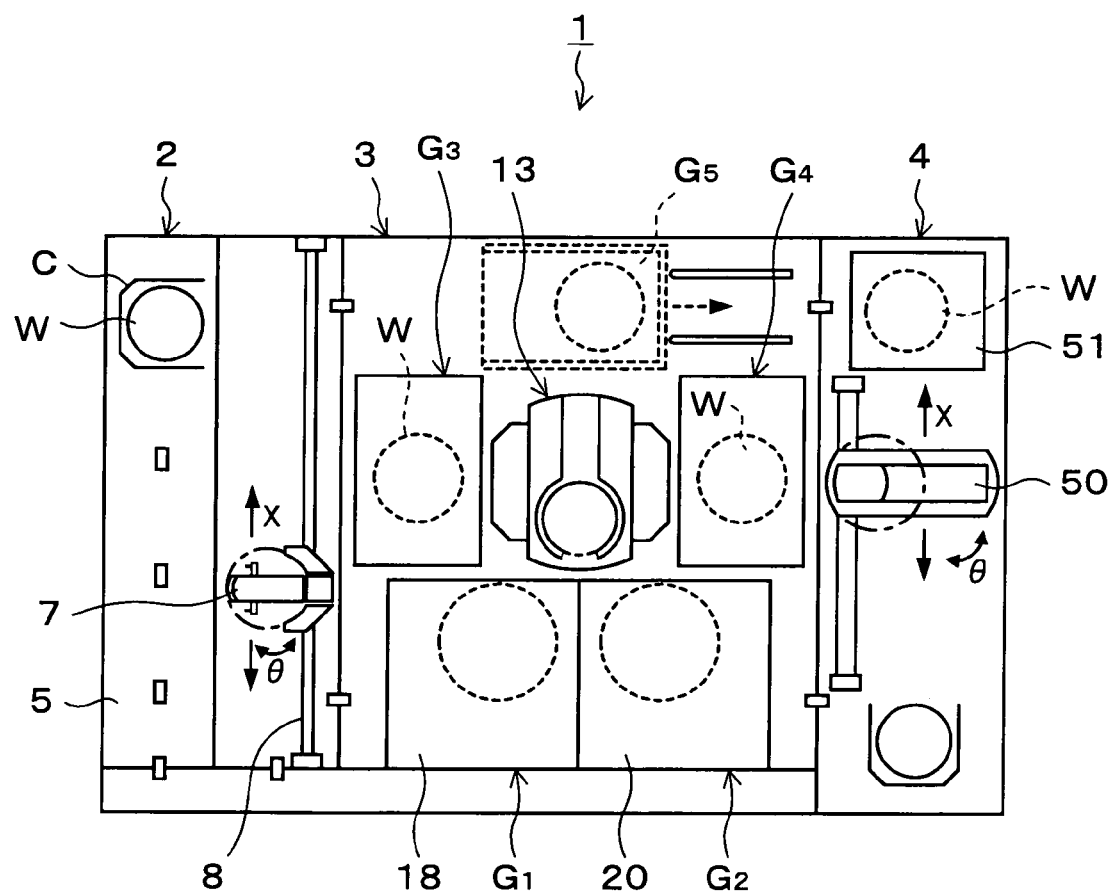
FIG. 1 is a plan view showing an outline of the structure of a coating and developing system having a PEB/COL unit according to an embodiment of the present invention.
Figure 2:
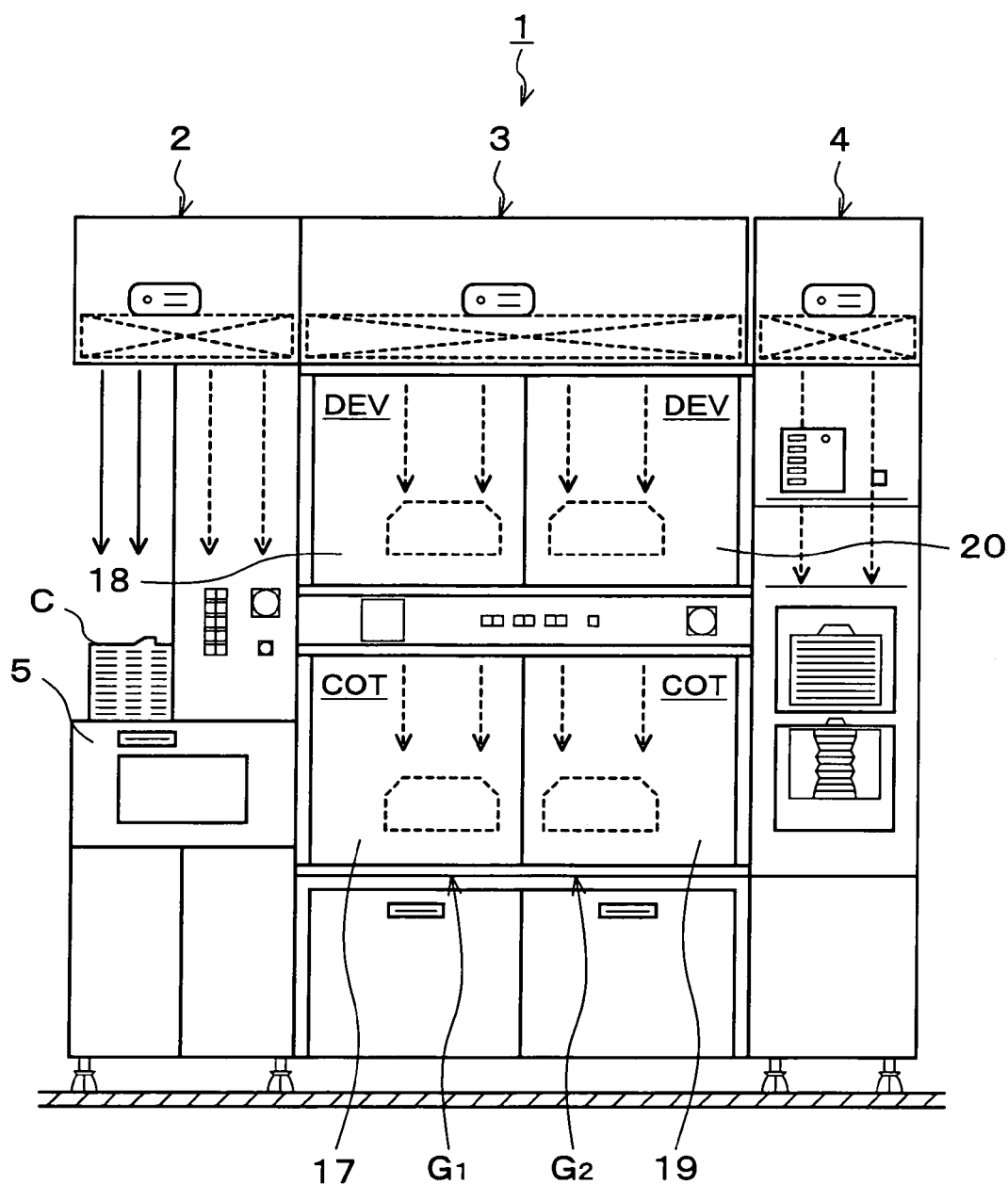
FIG. 2 is a front view of the coating and developing system in FIG. 1.
Figure 3:
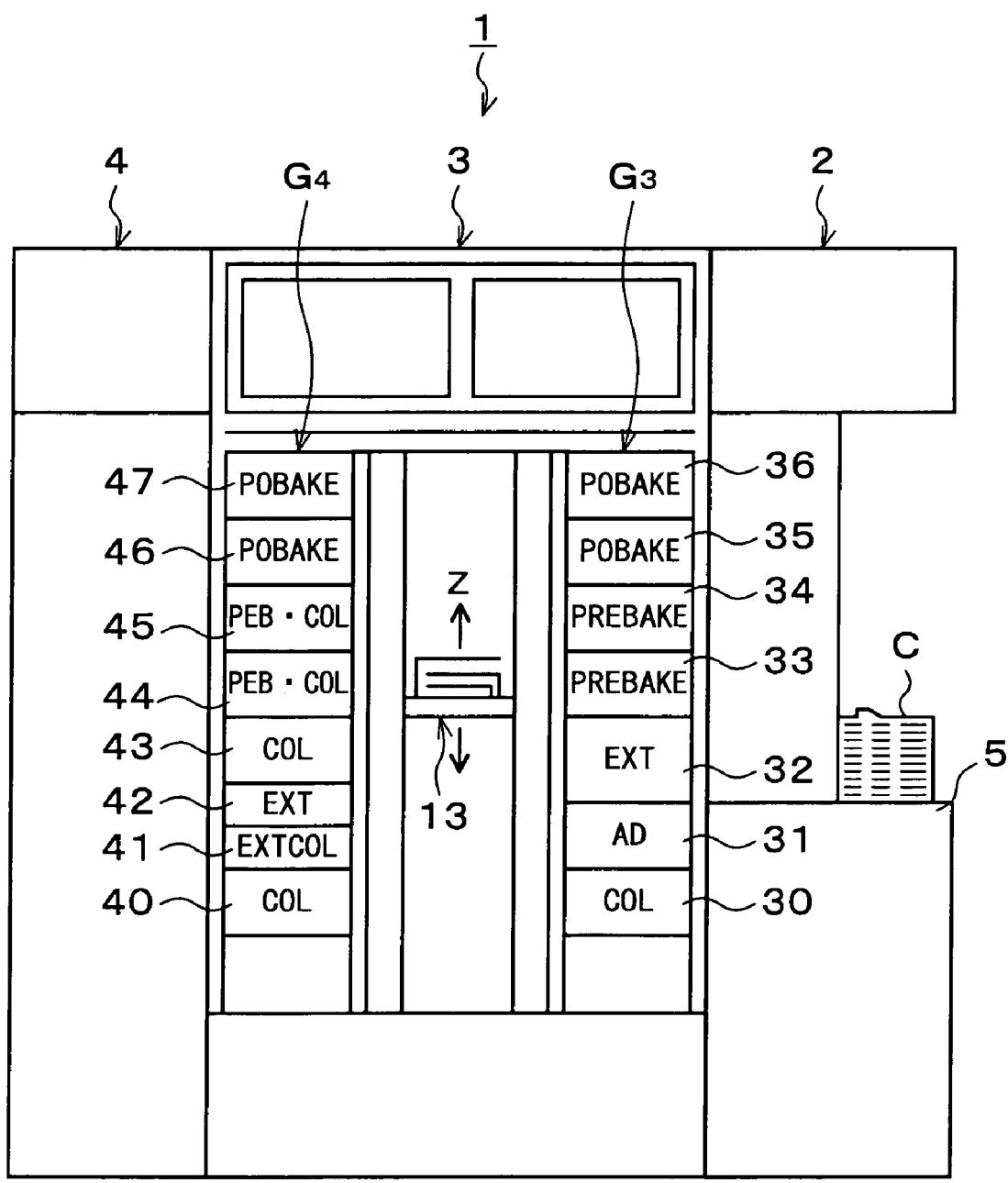
FIG. 3 is a rear view of the coating and developing system in FIG. 1.

A preferred embodiment of the present invention will be explained below. FIG. 1 is a plan view of a coating and developing system 1 having a heat processing apparatus according to the present invention, FIG. 2 is a front view of the coating and developing system 1, and FIG. 3 is a rear view of the coating and developing system 1.

As shown in FIG. 1, the coating and developing system 1 has a structure in which a cassette station 2 for carrying, for example, 25 wafers W per cassette, as a unit, from/to the outside into/from the coating and developing system 1 and carrying the wafer W into/out of a cassette C, a processing station 3 in which various kinds of processing units each for performing predetermined processing for the wafers W one by one in a coating and developing process are stacked in multiple tiers, and an interface section 4 for receiving and sending the wafer W from/to an aligner which is provided adjacent to the processing station 3 although not illustrated are integrally connected.

In the cassette station 2, a plurality of cassettes C can be freely mounted in a line in an X-direction (in a top-to-bottom direction in FIG. 1) at predetermined positions on a cassette mounting table 5 which is a mount portion. A wafer carrier 7 movable in the direction of arrangement of the cassettes (the X-direction) and in the direction of arrangement of the wafers W housed in the cassette C (a Z-direction, i.e., vertical direction) can freely move along a carrier path 8 and selectively get access to each of the cassettes C.

The wafer carrier 7 has an alignment function of aligning the wafer W. This wafer carrier 7 is structured to be able to get access to an extension unit 32 included in a third processing unit group G3 on the processing station 3 side as will be described later.

In the processing station 3, a main carrier unit 13 is disposed in the middle thereof, and around the main carrier unit 13, various processing units are stacked in multiple tiers to compose processing unit groups. In this coating and developing system 1, four processing unit groups G1, G2, G3, and G4 are disposed. The first and second processing unit groups G1 and G2 are disposed on the front side of the coating and developing system 1. The third processing unit group G3 is disposed adjacent to the cassette station 2. The fourth processing unit group G4 is disposed adjacent to the interface section 4. Moreover, a fifth processing unit group G5 shown by a broken line can be additionally disposed on the rear side as an option. The main carrier unit 13 can carry the wafer W into/out of under-mentioned various processing units disposed in these processing unit groups G1, G2, G3, and G4. The number and disposition of processing unit groups depend on the sort of processing performed for the wafer W, and the number of processing unit groups can be selected optionally.

In the first processing unit group G1, for example as shown in FIG. 2, a resist coating unit 17 for coating the wafer W with a resist solution and a developing unit 18 for subjecting the exposed wafer W to developing processing are stacked in two tiers from the bottom in order. Similarly, in the second processing unit group G2, a resist coating unit 19 and a developing unit 20 are stacked in two tiers from the bottom in order.

In the third processing unit group G3, for example as shown in FIG. 3, a cooling unit 30 for subjecting the wafer W to cooling processing, an adhesion unit 31 for enhancing adhesion of the resist solution to the wafer W, an extension unit 32 for making the wafer W wait, prebaking units 33 and 34 for drying a solvent in the resist solution, postbaking units 35 and 36 for subjecting the wafer W to baking processing after developing processing, or the like are stacked, for example, in seven tiers from the bottom in order.

In the fourth processing unit group G4, for example, a cooling unit 40, an extension/cooling unit 41 for naturally cooling the wafer W mounted therein, an extension unit 42, a cooling unit 43, post-exposure baking/cooling units (hereinafter referred to as "PEB/COL units") 44 and 45 as heat processing apparatus according to this embodiment, postbaking units 46 and 47, or the like are stacked, for example, in eight tiers from the bottom in order.

A wafer carrier 50 is provided in the middle of the interface section 4. The wafer carrier 50 is structured to be freely movable in the X-direction (the top-to-bottom direction in FIG. 1) and the Z-direction (the vertical direction) and rotatable in the θ-direction (the direction of rotation around a Z-axis) so as to be able to get access to the extension/cooling unit 41 and the extension unit 42 which are included in the fourth processing unit group G4, a peripheral exposure unit 51, and the aligner not illustrated to carry the wafer W to each of them.

Figure 4:
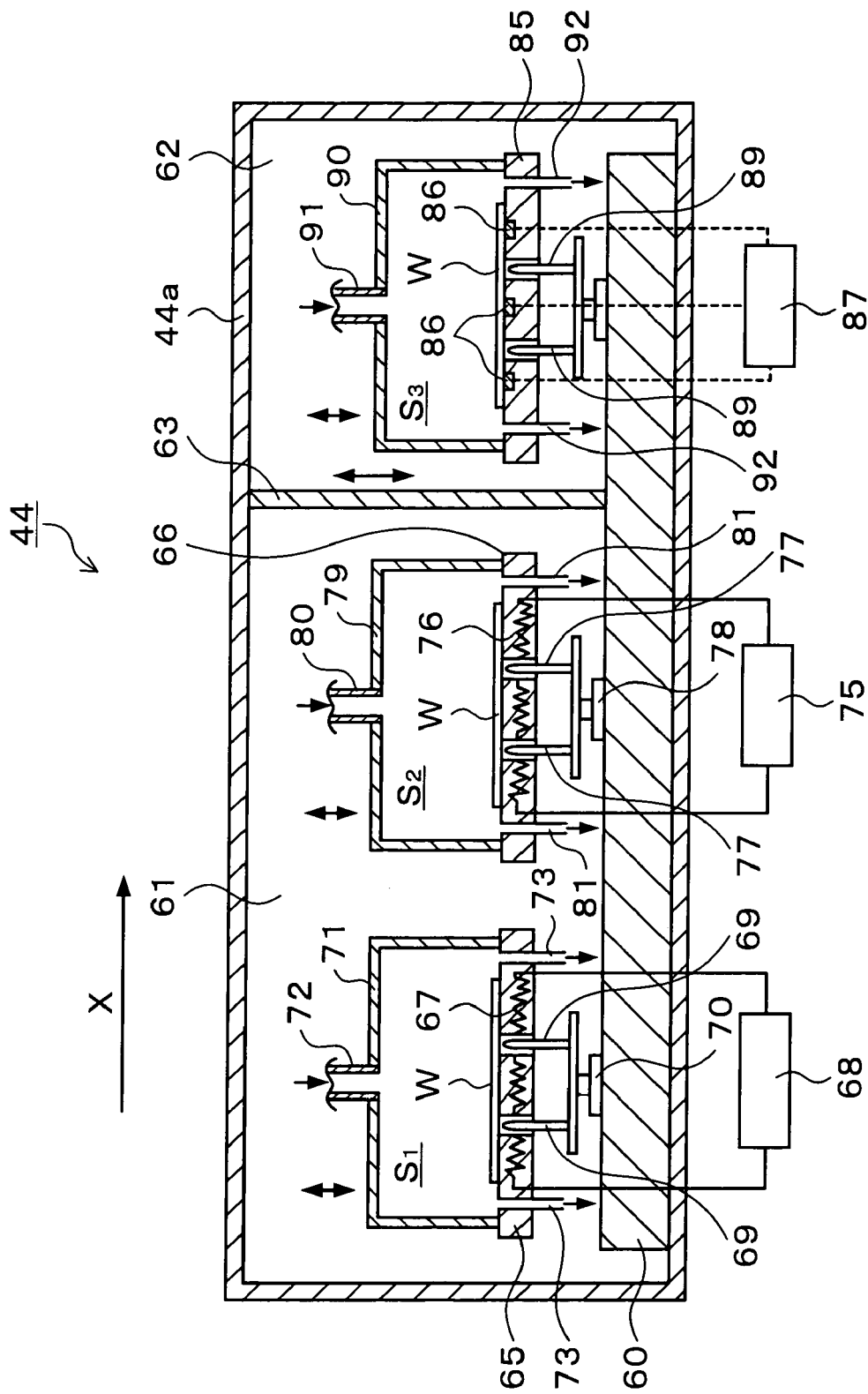
FIG. 4 is an explanatory view of a vertical section of the PEB/COL unit according to the embodiment.
Figure 5:
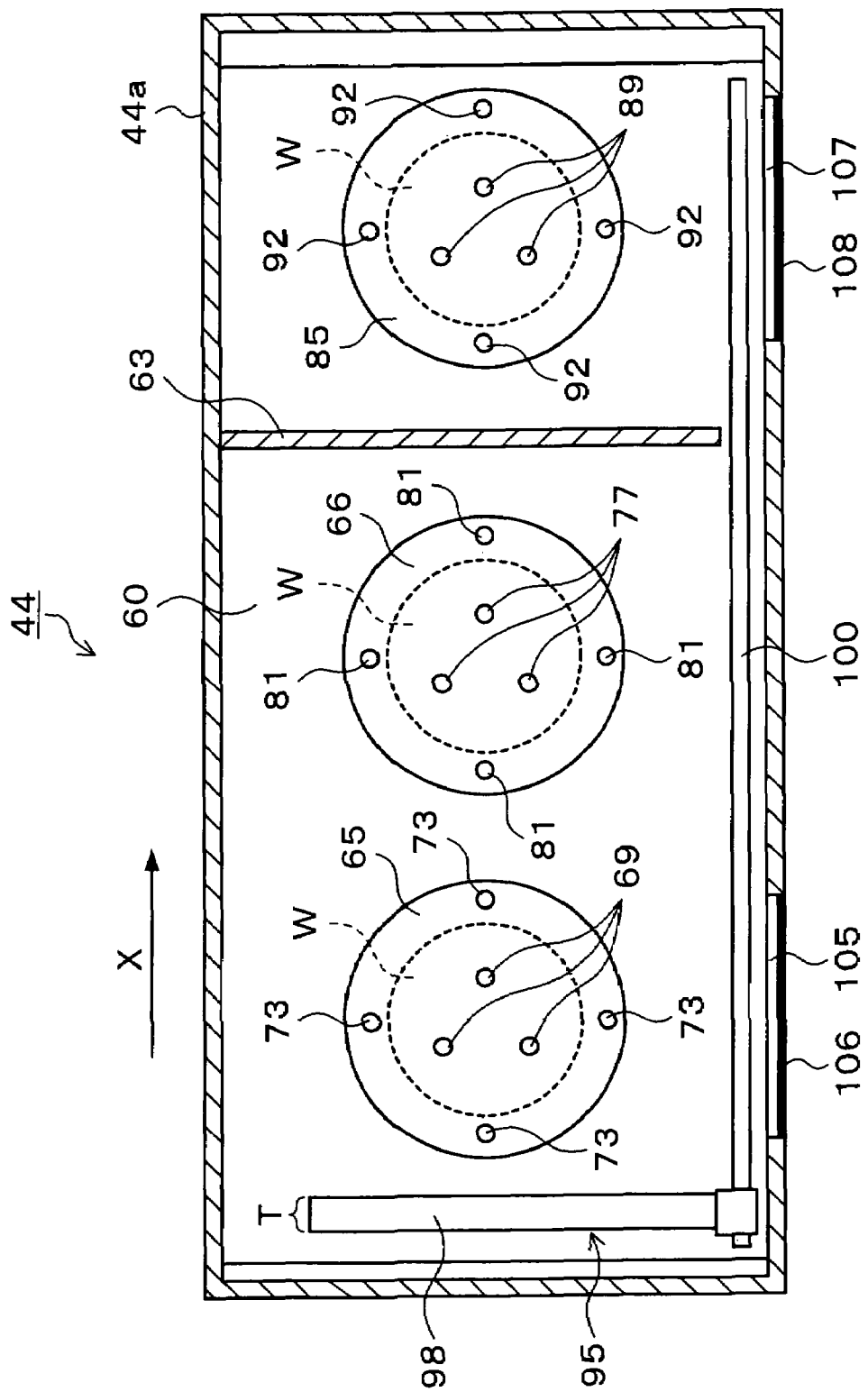
FIG. 5 is an explanatory view of a horizontal section of the PEB/COL unit in FIG. 4.

The structure of the aforesaid PEB/COL unit 44 will be explained in detail. FIG. 4 is an explanatory view of a vertical section showing an outline of the PEC/COL unit 44. FIG. 5 is an explanatory view of a horizontal section of the PEB/COL unit 44.

As shown in FIG. 4 and FIG. 5, a thick plate-shaped base 60 is provided inside a casing 44a of the PEB/COL unit 44. Provided on the base 60 is a partition plate 63 for partitioning the interior of the casing 44a into two processing chambers, that is, a heating chamber 61 as one processing chamber for performing baking processing of the wafer W and a cooling chamber 62 as the other processing chamber for performing temperature decreasing processing of the wafer W, thereby keeping the hot atmospheres in the respective processing chambers separate.

On the base 60 of the heating chamber 61, two disc-shaped heating plates each for mounting the wafer W thereon and heating the wafer W, that is, a first heating plate 65 and a second heating plate 66 are provided side by side in the longitudinal direction of the PEB/COL unit 44 (an X-direction shown in FIG. 4).

A heater 67 is contained in the first heating plate 65 on the side far from the partition plate 63 (the negative direction side of the X-direction shown in FIG. 4), the heating value of the heater 67 is controlled by a temperature controller 68. Accordingly, the heating value of the heater 67 can be controlled based on, for example, a set temperature $T_1$, set by the temperature controller 68, and the temperature of the first heating plate 65 can be maintained at the set temperature $T_1$.

A plurality of raising and lowering pins 69 for raising and lowering the wafer W while supporting it when the wafer W is carried in and out are provided under the first heating plate 65. The raising and lowering pins 69 can be moved vertically by a raising and lowering drive mechanism 70 so as to penetrate the first heating plate 65 from under the first heating plate 65 and protrude above the first heating plate 65.

A lid body 71 with its lower face open, which is vertically movable and forms a primary temperature increasing chamber $S_1$ integrally with the first heating plate 65, is provided above the first heating plate 65, so that a predetermined atmosphere can be maintained when the temperature of the wafer W is increased.

A supply port 72 for supplying an inert gas into the primary temperature increasing chamber $S_1$ is provided in the upper portion of the lid body 71, and exhaust ports 73 for exhausting the atmosphere in the primary temperature increasing chamber $S_1$ to the outside of the PEB/COL unit 44 are provided in an outer peripheral portion of the first heating plate 65. Accordingly, by supplying the inert gas into the primary temperature increasing chamber $S_1$ from the supply port 72 and exhausting the atmosphere in the primary temperature increasing chamber $S_1$ from the exhaust ports 73, a descending current is formed in the primary temperature increasing chamber $S_1$, and the interior of the primary temperature increasing chamber $S_1$ can be purged. Incidentally, nitrogen gas or helium gas can be used as the inert gas. Air or the like are also can be used.

The structure of the second heating plate 66 located on the partition plate 63 side (the positive direction side of the X-direction shown in FIG. 4) is exactly the same as that of the first heating plate 65. A heater 76 controlled by a temperature controller 75 is contained in the second heating plate 66, and the temperature of the second heating plate 66 can be maintained, for example, at a predetermined set temperature $T_2$ which is higher than the aforesaid set temperature $T_1$.

Raising and lowing pins 77 and a raising and lowering drive mechanism 78 for driving them are provided under the second heating plate 66, and the wafer W can be freely mounted on the second heating plate 66. Moreover, a lid body 79, which moves vertically and forms a secondary temperature increasing chamber $S_2$ integrally with the second heating plate 66, is provided above the second heating plate 66. A supply port 80 for supplying the inert gas is provided in the lid body 71, and exhaust ports 81 for exhausting an atmosphere in the secondary temperature increasing chamber $S_2$ are provided in an outer peripheral portion of the second heating plate 66.

Meanwhile, a disc-shaped temperature decreasing plate 85 for mounting the wafer W thereon and decreasing the temperature of the wafer W is provided above the base 60 of the cooling chamber 62. Peltier elements 86 are embedded in the temperature decreasing plate 85, and temperature decrease and temperature regulation of the wafer W are realized by these Peltier elements 86. The Peltier elements 86 are controlled by a temperature controller 87, and the temperature of the temperature decreasing plate 85 can be set, for example, at a predetermined temperature $T_3$ which is lower than the aforesaid predetermined temperature $T_2$.

Raising and lowering pins 89 which are driven vertically by a raising and lowering drive mechanism 88 are provided under the temperature decreasing plate 85 similarly to the first heating plate 65, whereby the wafer W can be mounted on the temperature decreasing plate 85.

A lid body 90, which moves vertically and forms a temperature decreasing chamber $S_3$ integrally with the temperature decreasing plate 85, is provided above the temperature decreasing plate 85. A supply port 91 for supplying the inert gas into the temperature decreasing chamber $S_3$ is provided in the lid body 90, and exhaust ports 92 for exhausting an atmosphere in the temperature decreasing chamber $S_3$ are provided in an outer peripheral portion of the temperature decreasing plate 85. Thereby, a descending current of the inert gas can be formed in the temperature decreasing chamber $S_3$, and the interior of the temperature decreasing chamber $S_3$ can be purged.

Figure 6:
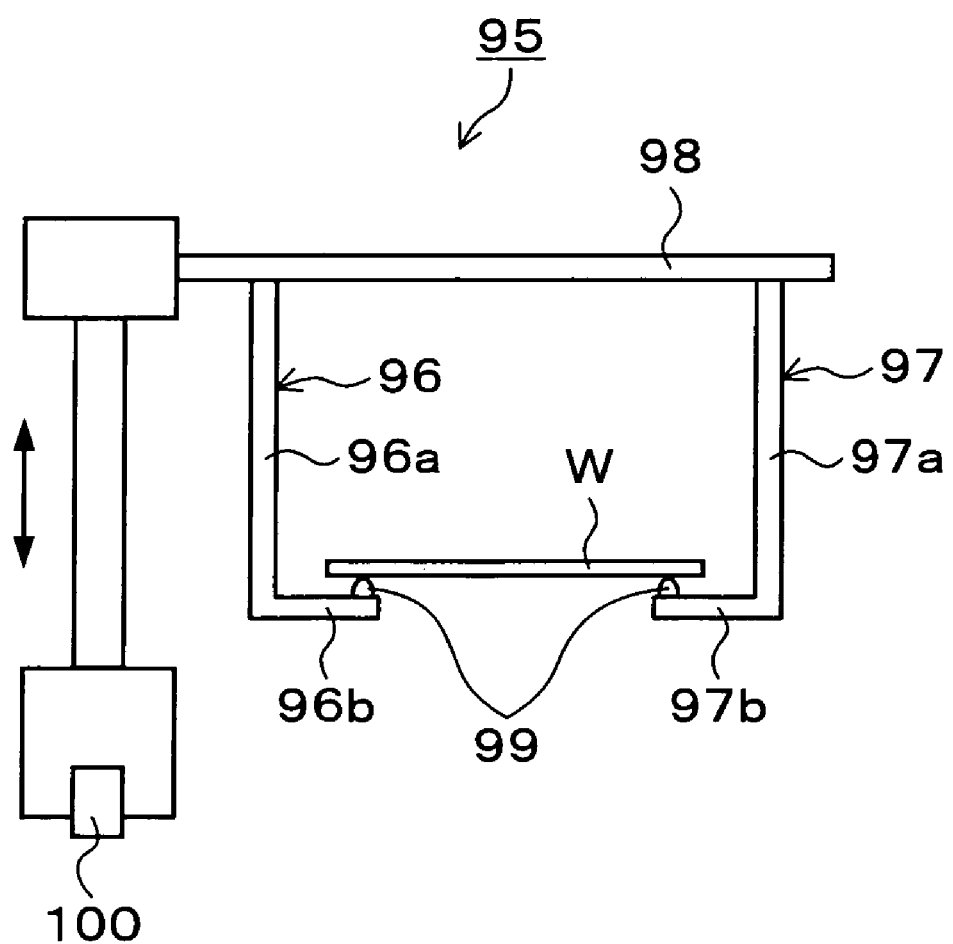
FIG. 6 is an explanatory view of a carrying means of the PEB/COL unit.

As shown in FIG. 5, a carrying means 95 for carrying the wafer W while supporting the rear surface of the wafer W stands by at a standby position T on the negative direction side of the X-direction of the first heating plate 65 and near a side wall of the casing 44a. As shown in FIG. 6, the carrying means 95 has two supporters 96 and 97 for supporting the rear surface of the wafer W from thereunder and an arm 98 for supporting the supporters 96 and 97 in such a manner to hang them. The two supporters 96 and 97 are respectively composed of vertical portions 96a and 97a extending downward from the arm 98 and horizontal portions 96b and 97b extending from the vertical portions 96a and 97a in a horizontal direction so as to face each other. Supporting pins 99 for supporting the wafer W are provided on the horizontal portions 96b and 97b, and when the wafer W is carried, the wafer W can be horizontally supported on the supporting pins 99 on the horizontal portions 96b and 97b.

The carrying means 95 can move on a rail 100 which extends in the X-direction along a side wall of the casing 44a as shown in FIG. 5, and the arm 98 of the carrying means 95 can move between the standby position T on the negative direction side of the X-direction of the first heating plate 65 and a position above the temperature decreasing plate 85. The arm 98 is vertically movable by a cylinder or the like, and hence by the movement of the horizontal portions 96b and 97b of the supporters 96 and 97 to a position below the rear surface of the wafer W and the ascent of the horizontal portions 96b and 97b, the supporting pins 99 can support the rear surface of the wafer W, and the carrying means 95 can carry the wafer W. Accordingly, the wafer W can be carried between the first heating plate 65, the second heating plate 66, and the temperature decreasing plate 85 by the carrying means 95.

A carrier opening 105 through which the wafer W is carried into the PEB/COL unit 44 is provided at a position opposite to the first heating plate 65 of the casing 44a as shown in FIG. 5. The carrier opening 105 is provided with a shutter 106, and the shutter 106 is closed except the occasion when the wafer W is carried in, so that a hot atmosphere inside the PEB/COL unit 44 does not flow to the outside.

A carrier opening 107 through which the wafer W is carried out is provided at a position opposite to the temperature decreasing plate 85 of the casing 44a, and a shutter 108 which freely opens and closes the carrier opening 107 is provided at the carrier opening 107.

The aforesaid partition plate 64 for dividing the heating chamber 61 and the cooling chamber 62 can be raised and lowered by a raising and lowering unit not illustrated, for example, an air cylinder or a motor. Thereby, only when the carrying means 95 moves between the heating chamber 61 and the cooling chamber 62, the partition plate 63 is lowered and a partition is removed. On the other occasions, the partition plate 63 is raised to partition the interior of the PEB/COL unit 44 in order to keep the hot atmospheres separate.

Next, the operation of the PEB/COL unit 44 structured as above will be explained with a photolithography process performed in the coating and developing system 1.

First, the wafer carrier 7 takes one unprocessed wafer W out of the cassette C and carries the wafer W into the adhesion unit 31 included in the third processing unit group G3. The wafer W coated with an adhesion promoter such as HMDS for improving its adhesion to the resist solution in this adhesion unit 31 is carried into the cooling unit 30 by the main carrier unit 13 and cooled to a predetermined temperature. Thereafter, the wafer W is carried to the resist coating unit 17 or 19 and supplied with the resist solution, and a resist film is formed on the wafer W. The wafer W on which the resist film is formed is carried to the prebaking unit 33 or 34, and the extension/cooling unit 41 in sequence by the main carrier unit 13 again and subjected to predetermined processing.

Subsequently, the wafer W is taken out of the extension/cooling unit 41 by the wafer carrier 50 and carried to the aligner (not illustrated) via the peripheral exposure unit 51. The wafer W which has undergone exposure processing is carried to the extension unit 42 by the wafer carrier 50, and then carried to the PEB/COL unit 44 or 45, in which temperature increasing, baking, and temperature decreasing processing which are post-exposure baking processing and cooling processing are performed, by the main carrier unit 13.

The wafer W which has undergone the post-exposure baking processing and the cooling processing is carried to the developing unit 18 or 20, the postbaking unit 35, 36, 46, or 47, the cooling unit 30 in sequence by the main carrier unit 13 and subjected to predetermined processing in each unit. The wafer W is then returned to the cassette C via the extension unit 32 by the wafer carrier 7, and successive predetermined coating and developing processing is completed.

Next, the operation of the aforesaid PEB/COL unit 44 will be explained in detail. First of all, before heat processing of the wafer W is started, the first heating plate 65 is maintained at the set temperature $T_1$ as a first predetermined temperature (which corresponds to "an intermediate temperature" in the present invention), for example, 60° C., the second heating plate 66 is maintained at the set temperature $T_2$ as a second predetermined temperature (which corresponds to "a predetermined high temperature" in the present invention), for example, 140° C., and the temperature decreasing plate 85 is regulated at the set temperature $T_3$, for example, 23° C.

When the heat processing of the wafer W is started, the lid body 71 is raised by a drive mechanism not illustrated, and the wafer W is carried into the PEB/COL unit 44 from the carrier opening 105 by the main carrier unit 13. The wafer W moved to a position above the first heating plate 65 is supported on the raising and lowering pins 69 which stand by at a predetermined position above the first heating plate 65. The temperature of the wafer W at this time is a temperature as a predetermined low temperature, for example, 23° C. at the time of the exposure process as the preceding process.

Subsequently, the lid body 71 is lowered, and the primary temperature increasing chamber $S_1$ is formed integrally with the first heating plate 65, at which time the supply of the inert gas from the supply port of the lid body 71 is started. By exhausting this inert gas from the exhaust ports 73 through the primary temperature increasing chamber $S_1$, a descending current is produced, and hereafter the atmosphere in the primary temperature increasing chamber $S_1$ is purged until temperature increase of the wafer W on the first heating plate 65 is completed.

Figure 7:
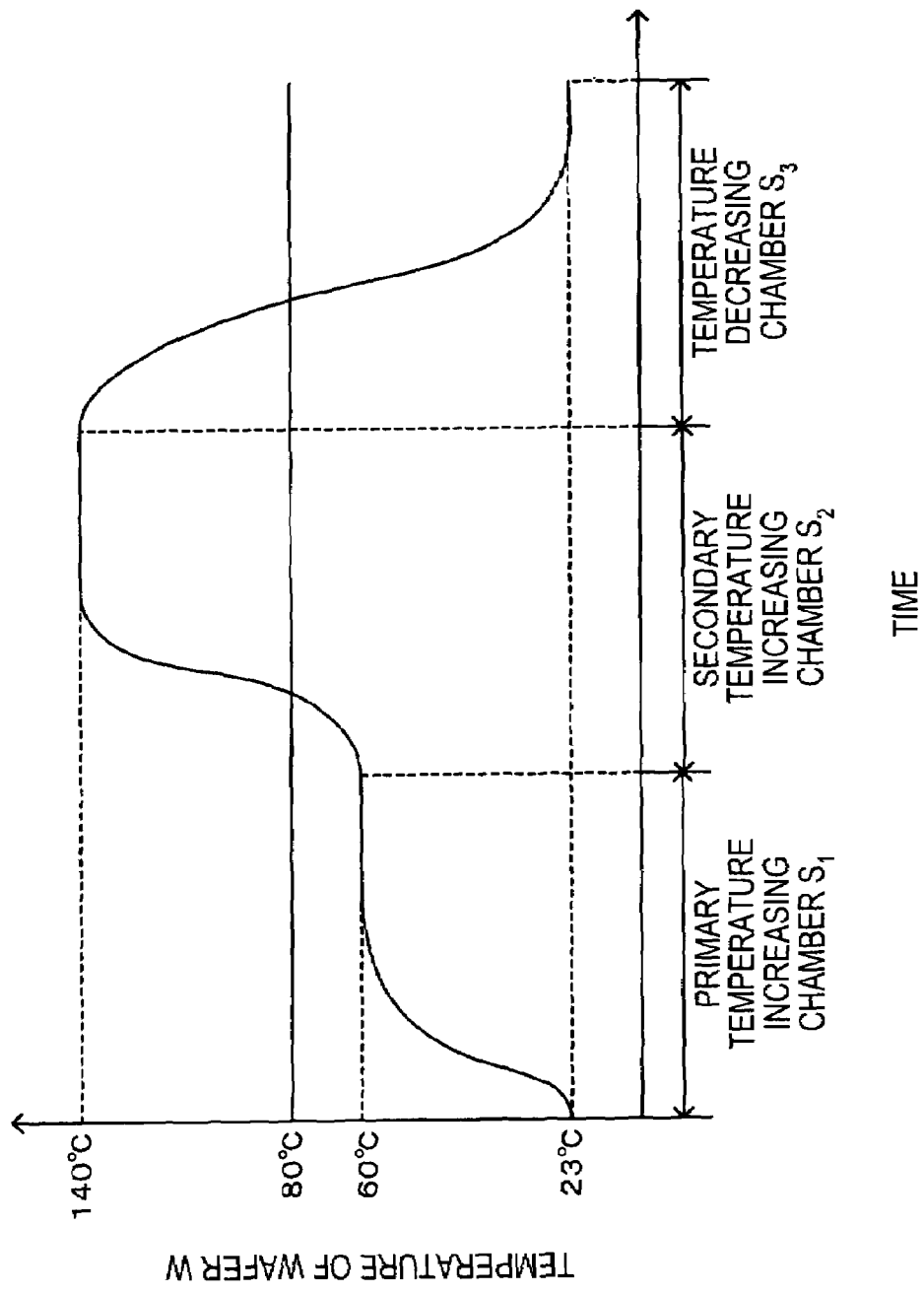
FIG. 7 is a graph showing a change in the temperature of a wafer with the lapse of time in heat processing in the embodiment.

Thereafter, the wafer W is lowered with the raising and lowering pins 69 by the raising and lowering drive mechanism 70, and mounted on the first heating plate 65. As soon as the wafer W is mounted, the temperature increase of the wafer W is started, and the temperature of the wafer W is increased from 23° C. to 60° C. as shown in FIG. 7. The wafer W is maintained for a predetermined period of time in a state in which the temperature of the wafer W reaches 60° C.

After the predetermined period of time, the wafer W is raised again by the raising and lowering pins 69, and the temperature increase of the wafer W by the first heating plate 65 is completed. Thereafter, the lid body 71 is raised, and the primary temperature increasing chamber $S_1$ is opened.

Subsequently, the carrying means 95 moves from the standby position T, and the horizontal portions 96b and 97b of the carrying means 95 are located below the wafer W. The wafer W is supported on the supporting pins 99 by raising the horizontal portions 96b and 97b. Thereafter, the carrying means 95 moves to a position above the second heating plate 66. The wafer W moved to the position above the second heating plate 66 is delivered to the raising and lowering pins 77, and as in the case of the first heating plate 65, the secondary temperature increasing chamber $S_2$ is formed by the lid body 79, and after the supply of the inert gas from the supply port 80 is started, the wafer W is mounted on the second heating plate 66.

When the wafer W is mounted on the second heating plate 66, the temperature of the wafer W is increased from 60° C. to 140° C. as shown in FIG. 7. On this occasion, a reaction of the resist film is started when the temperature of the wafer W exceeds 80° C. which is a reaction temperature $T_0$ of the resist film on the wafer W. Incidentally, the reaction temperature $T_0$ is determined by the type of the resist film.

Thereafter, the wafer W is baked at 140° C. for a predetermined period of time, and after the predetermined period of time, the wafer W is raised again by the raising and lowering pins 77, and baking processing, that is, post-exposure baking processing of the wafer W is completed.

In this case, if an atmosphere on the wafer W is stirred when the wafer W is heated to 140° C. past 80° C. which is the reaction temperature $T_0$ of the resist film, that is, when the wafer W is heated in the secondary temperature increasing chamber $S_2$, the reaction of the resist film on the wafer W is made more uniform, whereby more uniform heat processing can be realized.

Subsequently, the lid body 79 ascends, and the secondary temperature increasing chamber $S_2$ is opened. After the partition plate 63 is opened, the wafer W is carried from the second heating plate 65 onto the temperature decreasing plate 85 in the same way as the aforesaid carriage of the wafer W from the first heating plate 65 onto the second heating plate 66 by the carrying means 95.

The wafer W carried onto the temperature decreasing plate 85 is delivered to the raising and lowering pins 89, and then the lid body 90 descends to from the temperature decreasing chamber $S_3$. The wafer W is then lowered and mounted on the temperature decreasing plate 85, at which time temperature decrease of the wafer W is started, and the temperature of the wafer W is decreased from 140° C. to 23°

C. as shown in FIG. 7. On this occasion, the temperature of the resist film is decreased, and hence the reaction of the resist film is stopped.

When the temperature of the wafer W is decreased to 23° C., the wafer W is raised by the raising and lowering pins 89, and the temperature decrease of the wafer W is completed. Subsequently, the lid body 90 ascends, and the temperature decreasing chamber $S_3$ is opened. Then, the main carrier unit 13 enters the PEB/COL unit 44 through the carrier opening 107, receives the wafer W from the raising and lowering pins 89, and carries the wafer W out of the PEB/COL unit 44, and thus successive post exposure baking processing and cooling processing are completed.

According to the aforesaid embodiment, the temperature of the wafer W is temporarily increased to the set temperature $T_1$ lower than the reaction temperature $T_0$ of the resist film on the first heating plate 65, and the wafer W is maintained in this state for the predetermined period of time, whereby the temperature within the surface of the wafer W can be made uniform before the temperature of the resist film on the wafer W reaches the reaction temperature $T_0$. The temperature of the wafer W is then increased to the set temperature $T_2$ higher than the reaction temperature $T_0$ on the second heating plate 66, whereby the reaction of the resist film can be started in the state in which the temperature within the surface of the wafer W is uniform. Accordingly, the reaction of the resist film within the surface of the wafer W is performed uniformly, and the line width of a finally formed pattern can be made uniform within the surface of the wafer W.

Moreover, since the temperature of the wafer W which has undergone baking processing in the heating chamber 61 is decreased by the temperature decreasing plate 85 in the same PEB/COL unit 44, the carrying time can be shortened, and hence the temperature of the wafer W which has undergone post-exposure baking processing can be decreased quickly, and the reaction of the resist film can be stopped.

Further, since the partition plate 63 is provided between the heating chamber 61 and the cooling chamber 62, the hot atmospheres in the heating chamber 61 and the cooling chamber 62 can be kept separate, whereby heat processing in each processing chamber can be performed suitably without being influenced by heat from the other processing chamber.

Although the temperature of the wafer W heated to 140° is rapidly decreased nonstop to 230° C. in the cooling chamber 62 in the aforesaid embodiment, the temperature thereof may be decreased stepwise. In such a case, it is proposed that when the temperature of the wafer W is decreased, the temperature of the temperature decreasing plate 85 is changed while being controlled by the temperature controller 87. For example, the temperature of the temperature decreasing plate 85 is first set at 60° C., and the wafer W is mounted. After a lapse of predetermined period, the temperature of the temperature decreasing plate 85 is changed to 23° C. Hence, when the temperature of the wafer W is decreased, the temperature within the surface of the wafer W is made uniform temporarily at 60° C., and the nonuniformity of the temperature within the surface of the wafer W which occurs on the occasion of temperature decrease is suppressed, whereby thermal budget of the wafer W in this heat processing is made more uniform within the surface of the wafer W.

Further, the temperature of the wafer W may be decreased stepwise by using the first heating plate 65. In such a case, for example as stated above, the wafer W which is heated to 140° C. by the second heating plate 66 and has undergone post-exposure baking is carried to the first heating plate 65 again by the carrying means 95. The wafer W is then mounted on the first heating plate 65 and the temperature of the wafer W is decreased to 60° C. which is the set temperature $T_1$. The wafer W of which the temperature is decreased to 60° C. is carried to the temperature decreasing plate 85 again by the carrying means 95, and its temperature is decreased to 23° C. there. Thus, the temperature of the wafer W can be decreased stepwise without the temperature of the temperature decreasing plate 85 being changed.

Furthermore, although the carrying means 95 which is freely movable between the first heating plate 65, the second heating plate 66, and the temperature decreasing plate 85 is used in the aforesaid embodiment, a carrying means for carrying the wafer W between the first heating plate 65 and the second heating plate 66 and a carrying means for carrying the wafer W between the second heating plate 66 and the temperature decreasing plate 85, for example, may be provided separately.

Figure 8:
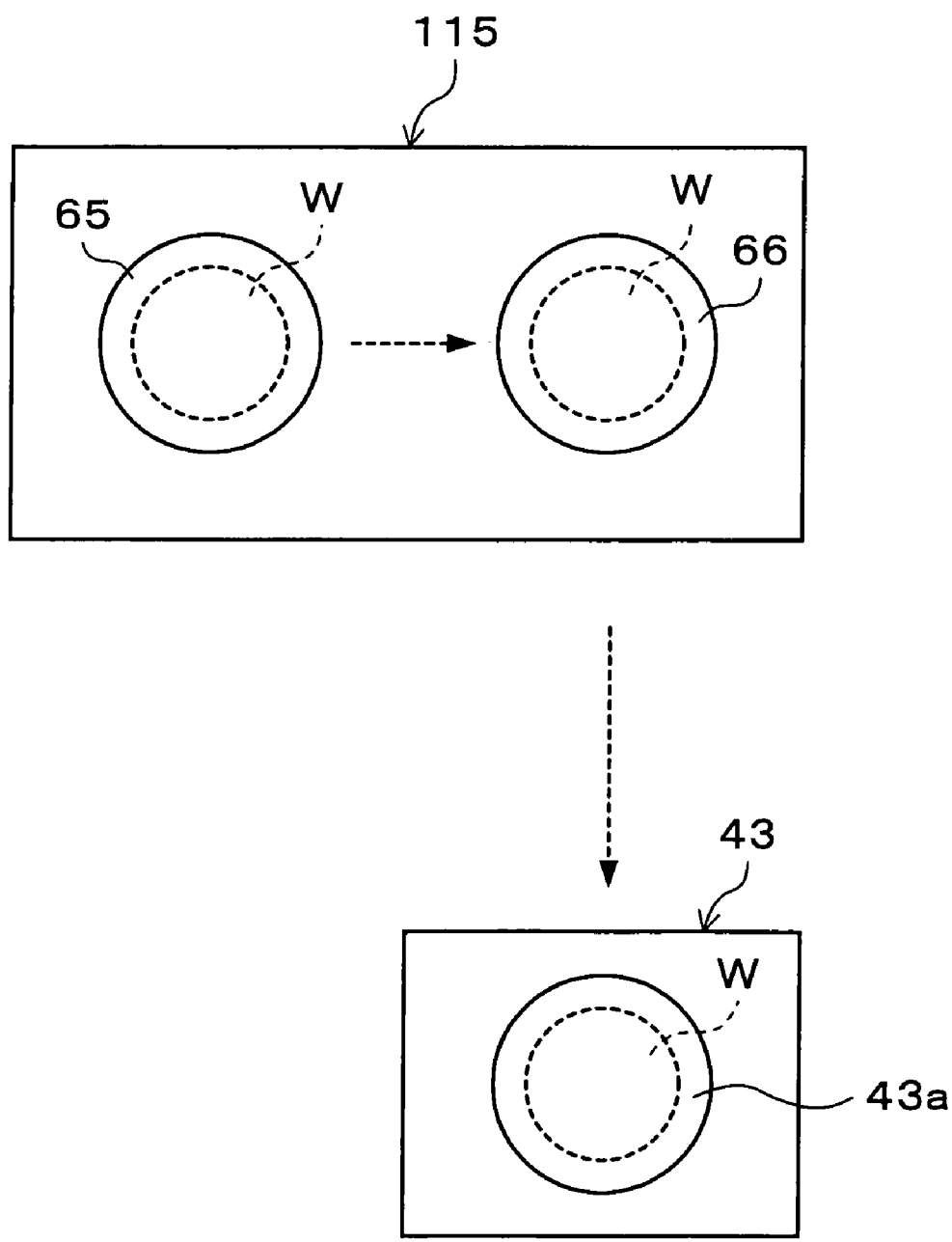
FIG. 8 is an explanatory view schematically showing the structure of another unit when the temperature of a wafer is decreased by the unit.
Figure 9:
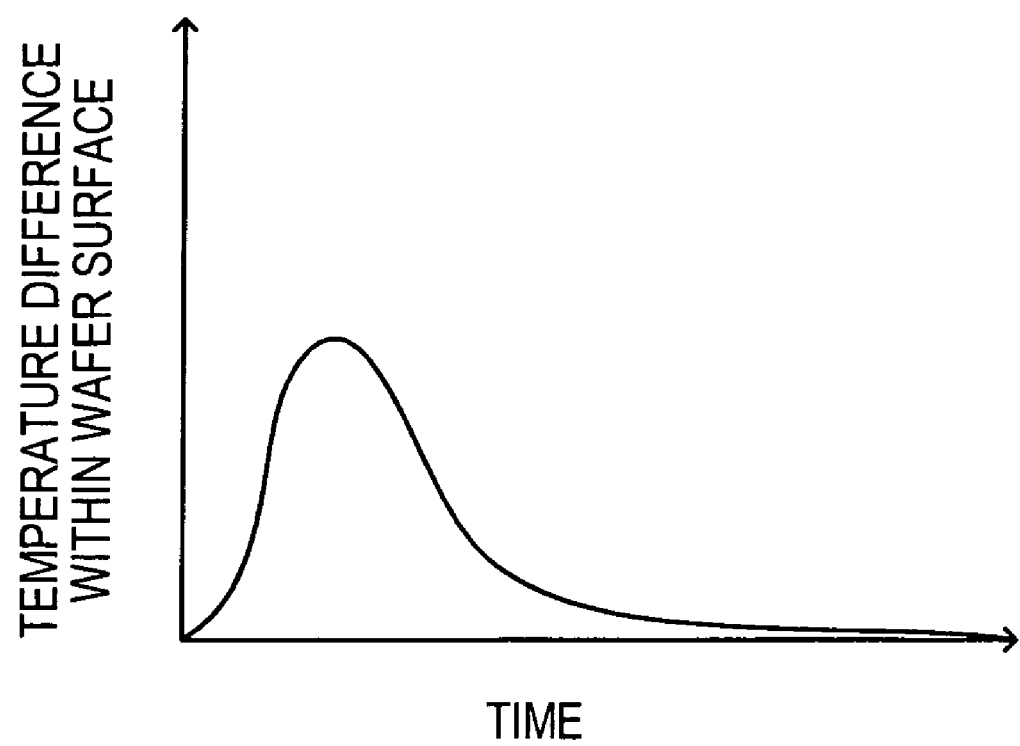
FIG. 9 is a graph showing the nonuniformity of the temperature within the surface of the wafer when the temperature of the wafer is increased.

The temperature increasing and baking processing and the temperature decreasing processing of the wafer W are performed in the same processing unit in the aforesaid embodiment, but the temperature increasing and baking processing and the temperature decreasing processing of the wafer W may be performed in separate processing units. In such a case, for example as shown in FIG. 8, it is proposed that they are performed by using a PEB unit 115 having only the first heating plate 65 and the second heating plate 66 without the temperature decreasing plate 85 in the PEB/COL unit 44 according to the aforesaid embodiment and the existing cooling unit 43. In the cooling unit 43, a temperature decreasing plate 43a with the same structure as that of the aforesaid temperature decreasing plate 85 is provided, so that the temperature of the wafer W can be decreased likewise with the aforesaid PEB/COL unit 44.

In the same manner as the aforesaid embodiment, for example, the temperature of the wafer W is increased from 23° C. to 60° C. on the first heating plate 65 of the PEB unit 115, maintained at this temperature for a predetermined period of time, and thereafter increased from 60° C. to 140° C. on the second heating plate 66, and the wafer W is baked. The wafer W is then carried to the cooling unit 43 by the main carrier unit 13, and the temperature of the wafer W is decreased from 140° C. to 23 ° C. on the temperature decreasing plate 43a of the cooling unit 43. Also in such a case, when the temperature of the wafer W is increased, the wafer W is temporarily maintained at 60° C. which is lower than the reaction temperature $T_0$, whereby the temperature within the surface of the wafer W can be made uniform before the reaction of the resist film on the wafer W is started, and the reaction of the wafer W can be started in the same timing by the subsequent temperature increase.

A substrate processing apparatus according to the aforesaid embodiment relates to the PEB/COL unit 44 or 45, but can be applied also to other heat processing units, for example, the prebaking unit 44 or 45 and the postbaking unit 35, 36, 46, or 47.

Moreover, although the embodiment stated above relates to the processing unit for the wafer W in photolithography of a semiconductor wafer device fabrication process, the present invention can be applied to processing apparatus for substrates other than a semiconductor wafer, for example, an LCD substrate.

Since the temperature of a coating film on a substrate reaches a reaction temperature in the same timing within the surface of the substrate when the temperature of the substrate is increased, the reaction time of the coating film can be made uniform within the surface of the substrate. Accordingly, the line width of a finally formed pattern can be uniformed, leading to a rise in yield. Moreover, the present invention is especially beneficial to heat processing of the substrate on which a so-called chemically amplified resist film is formed.

If the temperature of the substrate is decreased stepwise after being increased, the temperature of the substrate can be decreased with the ununiformity of the temperature within the surface of the substrate being further suppressed. As a result, the thermal budget within the surface of the substrate can be made uniform, resulting in a rise in yield.

If stepwise temperature decrease is carried out by means of the first heating plate used when the temperature of the substrate is increased, it becomes unnecessary to change the temperature of the temperature decreasing plate or the like while the temperature of the substrate is decreased, whereby the temperature of the substrate can be cooled rapidly, leading to an improvement in throughput.

What is claimed is:

1. A method of heat processing of a substrate on which a chemically amplified resist film is formed comprising the steps of:
    a first step of increasing the temperature of the substrate from a predetermined low temperature to a predetermined intermediate temperature by heating by a heating plate after the substrate is exposed, the predetermined intermediate temperature being lower than a predetermined reaction temperature at which the chemically amplified resist film reacts;
    a second step of maintaining the substrate at the predetermined intermediate temperature for a predetermined period of time; and
    a third step of increasing the temperature of the substrate to the predetermined high temperature that is higher than the predetermined reaction temperature; and
    baking said substrate at said predetermined high temperature;
    wherein the predetermined low temperature is less than the predetermined intermediate temperature and the predetermined intermediate temperature is lower than the predetermined high temperature,
    wherein said respective first to third steps are performed while the substrate is housed in a same heating chamber, and
    wherein said first step and said second step are performed on a first heating plate for mounting the substrate thereon and heating the substrate, and said third step is performed on a second heating plate for mounting the substrate thereon and heating the substrate.

2. A method as set forth in claim 1, further comprising the step of:
    decreasing the temperature of the substrate after said step of baking the substrate.

3. A method as set forth in claim 2,
    wherein the temperature of the substrate is decreased stepwise in said step of decreasing the temperature of the substrate.

4. A method as set forth in claim 1,
    wherein an atmosphere above the substrate is stirred in said third step.

5. A method as set forth claim 1, the intermediate temperature is approximately 60° C. to approximately 80° C.

6. A method as set forth in claim 1, wherein
    wherein said first step, said second step, and said third step are performed in a same processing apparatus, and further comprising a step prior to said first step of purging said same processing apparatus with an inert gas until temperature increase of the substrate is completed.

7. A method of heat processing of a substrate on which a chemically amplified resist film is formed comprising the steps of:
    a first step of increasing the temperature of the substrate from a predetermined low temperature to a predetermined intermediate temperature by heating by a heating plate after the substrate is exposed, the predetermined intermediate temperature being lower than a predetermined reaction temperature at which the chemically amplified resist film reacts;
    a second step of maintaining the substrate at the predetermined intermediate temperature for a predetermined period of time; and
    a third step of increasing the temperature of the substrate to the predetermined high temperature that is higher than the predetermined reaction temperature;
    baking said substrate at said predetermined high temperature; and
    decreasing the temperature of the substrate after said step of baking the substrate;
    wherein the predetermined low temperature is less than the predetermined intermediate temperature and the predetermined intermediate temperature is lower than the predetermined high temperature,
    wherein said respective first to third steps are performed while the substrate is housed in a same heating chamber,
    wherein said first step, said second step, said third step, and said step of decreasing the temperature of the substrate are performed in a same processing apparatus, and
    wherein said first step and said second step are performed on a first heating plate for mounting the substrate thereon and heating the substrate, said third step is performed on a second heating plate for mounting the substrate thereon and heating the substrate, and said step of decreasing the temperature of the substrate is performed on a temperature decreasing plate for mounting the substrate thereon and decreasing the temperature of the substrate.

8. A method of heat processing of a substrate on which a chemically amplified resist film is formed comprising the steps of:
    a first step of increasing the temperature of the substrate from a predetermined low temperature to a predetermined intermediate temperature by heating by a heating plate after the substrate is exposed, the predetermined intermediate temperature being lower than a predetermined reaction temperature at which the chemically amplified resist film reacts;
    a second step of maintaining the substrate at the predetermined intermediate temperature for a predetermined period of time; and
    a third step of increasing the temperature of the substrate to the predetermined high temperature that is higher than the predetermined reaction temperature;
    baking said substrate at said predetermined high temperature; and
    decreasing the temperature of the substrate after said step of baking the substrate;

wherein the predetermined low temperature is less than the predetermined intermediate temperature and the predetermined intermediate temperature is lower than the predetermined high temperature, wherein said respective first to third steps are performed while the substrate is housed in a same heating chamber, wherein said step of decreasing the temperature of the substrate comprises a fourth step of decreasing the temperature of the substrate to the predetermined intermediate temperature and a fifth step of decreasing the temperature of the substrate from the predetermined intermediate temperature to a predetermined temperature, wherein said first step, said second step, said third step, said fourth step, and said fifth step are performed in a same processing apparatus, and wherein said first step and said second step are performed on a first heating plate for mounting the substrate thereon and heating the substrate, said third step is performed on a second heating plate for mounting the substrate thereon and heating the substrate, and said fourth step is performed on the first heating plate, and said fifth step is performed on a temperature decreasing plate for mounting the substrate thereon and decreasing the temperature of the substrate.

* * * * *